United States Patent [19]

Hwang

[11] Patent Number: 4,514,250

[45] Date of Patent: Apr. 30, 1985

[54] METHOD OF SUBSTRATE HEATING FOR DEPOSITION PROCESSES

[75] Inventor: James C. Hwang, Berkeley Heights, N.J.

[73] Assignee: AT&T Bell Laboratories, Murray Hill, N.J.

[21] Appl. No.: 434,925

[22] Filed: Oct. 18, 1982

[51] Int. Cl.³ .................. B05D 3/06; H01L 21/20; C23C 13/00
[52] U.S. Cl. .................................. 156/610; 156/613; 156/DIG. 103; 118/725; 427/55; 427/86
[58] Field of Search ....... 156/607, 610, 613, DIG. 70, 156/DIG. 73, DIG. 103; 427/86, 55, 88; 118/725

[56] References Cited

U.S. PATENT DOCUMENTS

| 3,627,590 | 12/1971 | Mammel | 118/725 X |
| 3,634,150 | 1/1972 | Horn | 156/613 X |
| 4,081,313 | 3/1978 | McNeilly et al. | 156/610 |

FOREIGN PATENT DOCUMENTS 15226 1/1983 Japan ............................. 29/576 T Primary Examiner—Hiram H. Bernstein
Assistant Examiner—Joseph P. Carrier
Attorney, Agent, or Firm—Bruce S. Schneider

[57] ABSTRACT

Strain-free mounting and uniform heating of deposition substrates are achieved by coating the backside of the substrate such as a GaAs substrate with a reflective layer. A reflective environment formed, for example, by tantalum foils allows reflections between the reflective surface of the substrate and the reflective surface of the environment. These multiple reflections, in turn, produce uniform heating of the substrate.

13 Claims, 3 Drawing Figures

METHOD OF SUBSTRATE HEATING FOR DEPOSITION PROCESSES

BACKGROUND OF THE INVENTION

1. Field of the Invention

This invention relates to semiconductor processing and, in particular, to processes involving vacuum deposition of semiconductor materials.

2. Art Background

Often the particular sample holder employed in vacuum deposition processes, i.e., process performed at pressures less than 1 Torr is of little consequence. Generally minimal, if any, effort is devoted to the design of innovative sample holders for procedures involving the vacuum deposition of semiconductor materials from the vapor phase. However, in techniques such as molecular beam epitaxy (MBE) where extreme purity and crystal quality is generally desired, the specific substrate holder employed often makes a significant difference in the quality of the deposited material. Generally, for such applications it is desired that the substrate holder introduces only negligible strain into the substrate upon which deposition is to be performed. Additionally, the sample holder is also designed so that it does not substantially introduce contamination, e.g., impurities, into the deposited material.

A sample holder prevalently employed in MBE involves the use of a heater block formed from a refractory metal such as molybdemum and having a thickness which is large compared with that of the substrate. An intermediary material with a low melting point, e.g., indium, gallium or an alloy of indium and gallium is applied onto the block, and the entire structure is heated until the intermediary material melts. The substrate is then pressed against the molten intermediary material which wets and conforms to the substrate surface. During deposition the intermediary material remains molten, and the substrate is held by surface tension so that little strain is introduced. The molten intermediary material allows efficient heat conduction and the thick heater block assures uniform temperature distribution. The intermediary material, e.g., indium or gallium, generally does not contaminate the deposited material.

Despite these advantageous properties, the use of a refractory block in conjunction with a material such as indium or gallium does present certain difficulties. The mounting and dismounting of the substrate is time consuming and requires skillful execution to ensure uniform spreading of the intermediary material and to minimize trapping of gas between the substrate and the intermediary material. Additionally during deposition, gallium or indium forms an alloy with the III-V materials of the substrate. After deposition, the substrate is separated from the heater block while the intermediary material is in the molten state. However, after this separation, some of the intermediary material remains and regions are present which are formed by the interaction of the substrate and the intermediate material, e.g., in the case of a GaAs substrate, alloy regions of Ga/In and hillock shaped regions of InAs. These residues are subjected to a chemical etch which removes the remaining intermediary material, which also removes the alloy thus forming etch pits, and which leaves hillock regions such as InAs regions unaffected. The hillocks and pits cause significant problems in subsequent processing. For example, the hillocks interfere with the handling of the substrate by conventional equipment such as vacuum chucks. The parallelism of the top and bottom surfaces of the substrate is degraded producing lower yield during subsequent lithographic processing. Additionally, the uniform thinning of the substrate is often difficult since areas that originally contained pits are removed substantially before other regions.

The use of a relatively thick heater block also involves certain consequences that are not totally desirable. For example, the large thermal mass of the block prevents rapidly changing the temperature of the substrate during deposition. A rapid temperature change, however, is often desirable in situations where heterostructure growth is involved.

The alternatives to the use of an intermediary material, such as indium or gallium, are even more undesirable. The use of spring clips or other contact devices which apply pressure to provide thermal contact between the substrate and the heater block generally introduces an unacceptable level of strain which produces undesirable effects such as lower charge carrier mobility in the deposited semiconductor material. Further, the use of spring clips does not produce a uniform contact between the substrate and the block. Thus heat reaching the substrate must, in this situation, predominantly through radiative, not conductive, transfer. (Convection is precluded since the deposition is performed at low pressures.) However, typical III-V semiconductor substrates such as GaAs and InP of nominal thicknesses, 250 to 750 $\mu$m, are substantially transparent to infrared radiation. Thus, in the absence of an intermediary material such as indium for heat conduction, heating is quite inefficient since little radiative energy is absorbed. The additional heat required by this inefficient heat transfer produced additional outgassing of impurities which, in turn, adversely affects the quality of the deposited layers. Thus, although present sample holder configurations are often acceptable, improvement is certainly desirable.

SUMMARY OF THE INVENTION

Excellent results are achievable in vacuum deposition processes where the uniform transfer of heat through convection is not available. These results are attained through the use of (1) a highly reflective layer applied to the major surface of the substrate which is opposite the major surface upon which deposition is to be performed and through the use of (2) a reflective environment allowing multiple reflections of thermal radiation incident on the substrate reflective layer. In particular, extremely uniform heating of the substrate such as a GaAs or InP substrate is obtained without introducing substantial strain, substantial morphological defects, or substantial impurities into the substrate or the deposited layers. Radiant energy is, for example, made incident on the reflective layer of the substrate. This energy is predominately reflected and only a small fraction of incident energy is initially absorbed. The reflected radiation is, in turn, reflected by the surrounding reflected region until it re-encounters the reflective layer of the substrate. As before, most of the multiply reflected energy is again reflected and only a small portion absorbed. However, through the repetitive multiple reflection process, sufficient energy is absorbed to heat the reflective layer and thus the substrate. Since only small amounts of energy are absorbed in any single contact between a portion of the reflective layer and the incident energy and since the multiple reflection causes complete illumination of this layer, extremely uniform heating is produced. Additionally, since the reflective layer is quite thin, essentially no strain is induced in the substrate. Use of refractory materials for the substrate reflective layer, such as tungsten, ensures that substantially no reaction occurs between this layer and the substrate and also ensures substantially no impurities are introduced by this layer into the deposited material. Significantly, in contrast to other typical heating techniques, a highly reflective rather than a highly absorptive material is employed to transfer heat to the deposition substrate. Thus by utilizing a layer which by itself is difficult to heat, the layer in combination with a reflective environment, efficiently produces uniform, relatively rapid heating.

DETAILED DESCRIPTION

Figure 1:
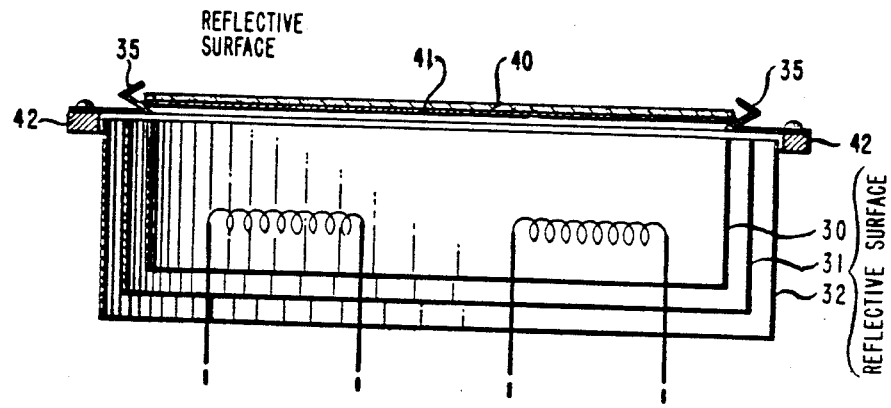
FIG. 1 is illustrative of suitable heating configurations with the invention.

The reflective layer employed on the substrate material should have a reflectivity to incident energy of at least 80 percent. The reflectivity of a layer depends on the energy spectrum of the radiant energy source and on the angle of incidence of energy on the substrate reflective layer. The reflectivity of a layer, for purposes of this invention, is the amount of energy reflected relative to the amount of incident energy for a given incident energy spectrum averaged over all angles of incidence. Typically, the reflectivity of a smooth layer of refractory metal, such as tungsten, is sufficient to satisfy this requirement.

Additionally, since the reflective layer is formed on the substrate, this material should not adversely interact with the substrate material or contaminate the deposited semiconductor material. For example, it is disadvantageous to use a material such as gallium which alloys and reacts with the substrate material, e.g., GaAs, in a manner which adversely affects the substrate morphology upon subsequent processing. Similarly, the use of a reflective material such as gold is not advantageous since the gold tends to diffuse into the deposited semiconductor material causing formation of charge carrier traps. Not only should materials which cause disadvantageous interactions at room temperature be avoided, but similarly materials which cause such interactions at the temperatures to be employed in the deposition procedure should also not be employed.

The reflective layer should not cause substantial strain in the substrate, i.e., strain greater than 1 percent. It is typically possible to avoid such strain simply by employing a reflective layer that is relatively thin. Generally, metal layers, uniformly deposited on a polished substrate, having a thickness in the range of 100 Å to 10,000 Å produce the desired reflectivity without causing substantial strain in the substrate. Layers thinner than 100 Å generally are not desirable since they tend to be discontinuous and thus produce areas which are not sufficiently reflective. Layers thicker than 10,000 Å for typical materials which afford an appropriate reflectivity generally cause unacceptable strain in the substrate and tend to separate from the substrate. However, the use of a material which has a sufficiently close match in thermal expansion coefficient to that of the substrate material, so that strain is not produced by thicker layers, is not precluded.

The reflective material employed should have a sufficiently high absorption coefficient so that the radiant energy which is not reflected from its surface is essentially totally absorbed in the reflective layer and not transmitted through to the substrate. (If $I_o$ is the original intensity of incident energy, I, the intensity after passing through a thickness, x, of the reflective material with an absorption coefficient, k, then $I = I_o \exp(-kx)$.) For layer thicknesses in the range 100 Å to 10,000 Å generally materials having absorption coefficients greater than $10^6 cm^{-1}$ yield the desired results.

As discussed, it is desired that through multiple reflections, the radiant energy is uniformly distributed and absorbed across the substrate reflective layer. The smaller the area of the reflective layer initially illuminated by radiant energy the greater the reflectivity of this layer should be to ensure uniform heating. (It is possible initially to reflect radiant energy from the surrounding reflective region to the substrate reflective region. Initially incident with the substrate reflective layer, in this context, means the first impact of energy with this layer.) Thus, if a collimated radiation source is used, which initially impacts only a small portion of the reflective layer, many multiple reflections are required to spread this initial energy over the entire reflective layer surface area. In contrast, if a diffuse source is employed, fewer reflections are required to distribute the incident energy uniformly across the reflective layer. A controlled sample is employed to determine the necessary reflectivity for a given radiant heat source.

As previously discussed, multiple reflections are produced by the reflective layer associated with the substrate in conjunction with a reflective environment. (The reflective environment need not totally surround the substrate but generally more efficient heating is attained when it does.) This reflective area should be sufficiently small in volume and should be suitably configured so that substantial radiant energy is not transmitted to regions, which when heated, produced substantial outgassing, e.g., outgassing which raises the ambient pressure in the deposition chamber such as an MBE deposition chamber by more than $1 \times 10^{-11}$ Torr. Typically to achieve the desired reflectivity and limit outgassing, smooth refractory metals are utilized in a configuration such as shown in FIG. 1. Use of materials, such as refractory materials, avoids the excessive heating of the reflective environment and thus does not contribute to outgassing. In particular, if a multiple layer body is employed, the layer farthest from the source of radiant energy is maintained substantially at the ambient temperature of the chamber and does not cause enhanced outgassing. The reflectivity of the surrounding body should be at least 80 percent to ensure that the radiant energy is ultimately absorbed by the reflective layer associated with the substrate and to adequately limit outgassing. (The reflectivity of the surrounding body is measured in the same manner as that of the substrate reflective layer.) It is also generally desirable that the surrounding body be configured to take up a relatively small volume, i.e., a volume less than $L^3$, where L is the longest dimension of the substrate. Larger volumes tend to necessitate the use of larger vacuum chambers with associated unacceptable cost. Because of the use of highly reflective material, this volume requirement is generally easily satisfied.

The following examples are illustrative of the subject invention.

EXAMPLE 1

Deposition of GaAs was performed on a GaAs substrate (2 inch diameter and 20 thousandths of an inch thick) that had been doped with chromium so that its resistivity was approximately $10^7$ ohm-cm. This deposition was accomplished utilizing a Varian GEN II molecular beam apparatus. The apparatus was modified by replacing the typical molybdenum block substrate holder with the substrate holder shown in FIG. 1. In the substrate holder of FIG. 1, four tungsten heater elements were employed. The elements were positioned so that they were equally spaced on an imaginary circle having a radius of one-half inch. Each of the layers, 30, 31, and 32, of the surrounding reflective region were fabricated from tantalum foil which had a thickness of approximately one-thousandth of an inch. The inside layers, 30 and 31, were dimpled to produce an offset between foil layers and thus to reduce the contact between the three layers. The inner foil had a reflectivity of approximately 90 percent. Passive clips, 35, were provided and exerted essentially no stress on the substrate, 40. There was sufficient clearance between the clip and the substrate to allow the substrate to move freely even at the growth temperature. The clips were made of thin tantalum wire to reduce contact with the substrate and thus reduce the heat loss through conduction. The filament elements were spaced approximately a quarter inch from the inside tantalum foil and approximately a half inch from the closest surface of the substrate having the reflective layer. The clips, 35, were supported by a molybdenum ring, 42, and attached to that ring with molybdenum screws.

On preparation for MBE deposition, a 1000 Å thick layer, 41, of tungsten was sputtered and deposited onto one of the major surfaces of the GaAs wafer using a Varian SGUN (a trademark of Varian Associates). A tungsten target having a purity of approximately 0.9995 and measuring 5 inch in diameter was employed for the sputtering process. Argon at a pressure of approximately $3 \times 10^{-3}$ Torr was introduced after the deposition apparatus was evacuated to $3 \times 10^{-7}$ Torr. A d.c. bias of 500 V and a power of 2.5 KW was applied to the electrode. This caused a tungsten deposition rate of approximately 100 Å/min which was discontinued after a period of 10 minutes to yield a layer thickness of 1000 Å. The built in stress in the deposited layer was less than $3 \times 10^9$ dyne/cm$^2$.

After the substrate with its reflective layer was thoroughly cleaned, it was inserted into the clips, 35, of molybdenum ring, 42, with the bare face of the substrate facing up. The clips and the ring were inserted into a chamber and the chamber was evacuated to a pressure of $10^{-7}$ Torr. The sample was then transferred into a second chamber at a pressure of approximately $10^{-9}$ Torr. The substrate was then heated by an apparatus of the design outlined in FIG. 1 to a temperature of 200 degrees C. for approximately 1 hour. This temperature was achieved by passing current through the heater filaments to produce radiative heating of the substrate. The temperature was measured utilizing a thermocouple that was in close proximity to the substrate reflective layer. The thermocouple was, however, shielded from radiation originating from the filaments.

The molybdenum ring, with its clips and substrate, was then transferred to the growth chamber and placed onto a second heater having the design shown in FIG. 1. The substrate reflective surface was positioned so it faced the heater elements. A power of 100 W which passed through the filaments increased the substrate temperature at a rate of 500 degree C./min (as compared to approximately 100 degree C./min for a molybdenum heater block in conjunction with an indium intermediary layer). Sufficient current was passed through the filaments to maintain a temperature of approximately 600 degrees C. as determined by a thermocouple. (The thermocouple had previously been calibrated using the eutectic point of aluminum/silicon.) The deposition of an undoped GaAs layer on the bare surface of the GaAs substrate was completed as described in J. C. M. Hwang Case 3, Example 1, application Ser. No. 376,178, filed May 7, 1982, which is hereby incorporated by reference.

After GaAs deposition, the reflective tungsten layer was removed by RF plasma etching. The substrate was placed on the sample holder of a barrel etcher. The etchant contained 20 percent oxygen and 80 percent $CF_4$. The combined pressure of the etchant gasses was approximately 1 Torr. The applied RF (13.56 MHz) power to establish the plasma was approximately 150 W which was applied over a region of approximately 1 foot in length and 8 inches in diameter. The plasma treatment was continued for approximately 30 minutes to remove the tungsten layer.

The deposited GaAs layer, after removal of the tungsten, had a thickness of approximately 5 μm, appeared uniform and smooth, and had a background carrier concentration of less than $1 \times 10^{13}$ cm$^3$, i.e., had a background carrier concentration less than that which is measurable utilizing conventional capacitance-voltage profiling techniques. The side of the substrate initially contacting the tungsten layer appeared extremely smooth.

EXAMPLE 2

Figure 2:
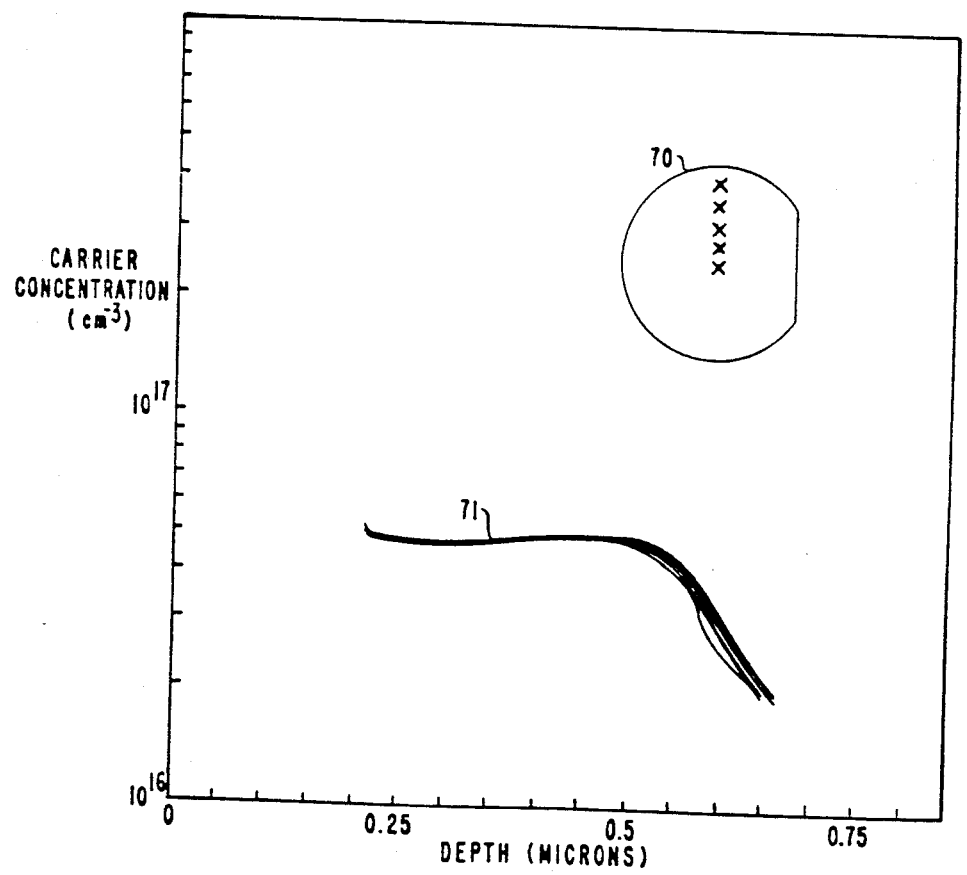
FIGS. 2 and 3 illustrate results achievable with the subject invention.
Figure 3:
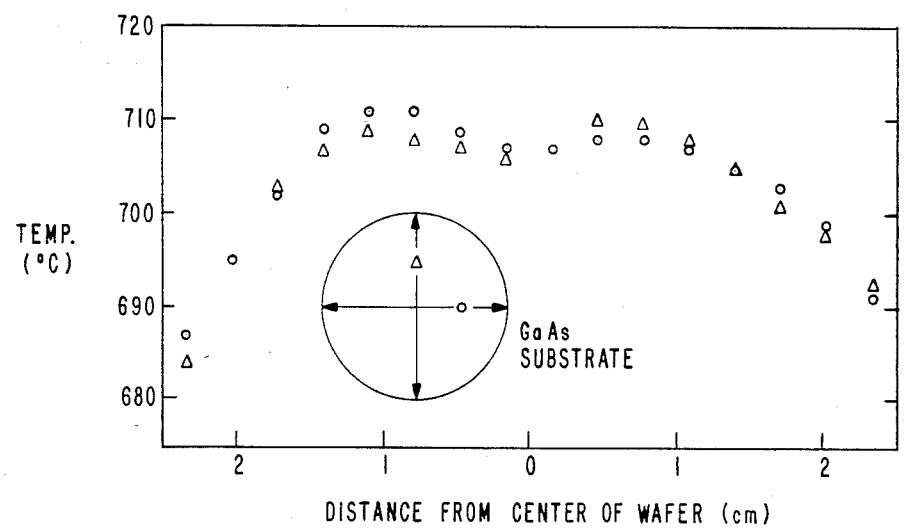

The procedure of Example 1 was followed except after deposition of a 1 μm thick undoped GaAs layer a half micron thick layer doped with silicon (majority carrier concentration $5 \times 10^{16}$ cm$^3$) was deposited onto the undoped layer as described in J. C. M. Hwang Case 3, Example 2, application Ser. No. 376,178, filed May 7, 1982. The carrier concentration of the doped layer was measured at five spots on the wafer as shown at 70 in FIG. 2 and the five profiles measured from the surface perpendicularly into the substrate is shown in the plot, 71, of FIG. 2. As can be seen from the plot, both the carrier concentration and the thickness of the doped layer is quite uniform. The mobilities were also measured utilizing the Van der Pauw technique. At room temperature this mobility was approximately 4700 cm$^2$/V·s which is a desirable level for high-quality GaAs material having this particular doping level. The temperature distribution of the substrate during deposition along the mutually perpendicular directions shown in FIG. 3 were measured and demonstrated excellent uniformity as shown by the graph of FIG. 3.

What is claimed is:

1. A process for vacuum depositing a material on a heated substrate comprising the steps of heating said substrate to a temperature that induces deposition of said material from a deposition medium and forming said material on said heated substrate by contacting said substrate with said medium characterized in that said deposition is performed at reduced pressures, and said heating comprises (1) providing said substrate with a surface, other than that upon which said deposition is to occur, that is at least 80 percent reflective, (2) providing a reflective environment for said reflective surface, and (3) providing radiant energy which is in part absorbed during any single impact with said reflective surface wherein the combination of said reflective surface and said reflective surrounding causes multiple reflection of the predominant portion of said radiant energy.

2. The process of claim 1 wherein said substrate comprises InP.

3. The process of claim 1 wherein said material comprises GaAs.

4. The process of claim 1 wherein said process for vacuum deposition is a molecular beam epitaxy process.

5. The process of claim 1 wherein said radiant energy is produced by a heated filament.

6. The process of claim 1 wherein said reflective surface is formed by a composition comprising a refractory metal.

7. The process of claim 6 wherein said refractory metal comprises tungsten.

8. The process of claim 1 wherein said reflective environment is provided by a refractory metal.

9. The process of claim 8 wherein said metal comprises tantalum.

10. The process of claim 1 wherein said substrate comprises GaAs.

11. The process of claim 10 wherein said material comprises GaAs.

12. The process of claim 10 wherein said reflective surface is formed by a composition comprising a refractory metal.

13. The process of claim 12 wherein said metal comprises tungsten.

* * * * *